United States Patent
Male et al.

(10) Patent No.: US 12,187,601 B2
(45) Date of Patent: *Jan. 7, 2025

(54) ELECTRONIC SENSORS WITH SENSOR DIE IN PACKAGE STRUCTURE CAVITY

(71) Applicant: TEXAS INSTRUMENTS INCORPORATED, Dallas, TX (US)

(72) Inventors: Barry Jon Male, West Granby, CT (US); Benjamin Cook, Addison, TX (US); Robert Alan Neidorff, Bedford, NH (US); Steve Kummerl, Carrollton, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/247,118

(22) Filed: Jan. 14, 2019

(65) Prior Publication Data
US 2019/0144267 A1 May 16, 2019

Related U.S. Application Data

(63) Continuation of application No. 15/372,565, filed on Dec. 8, 2016, now Pat. No. 10,179,730.

(51) Int. Cl.
*H01L 23/28* (2006.01)
*B81B 7/00* (2006.01)
(Continued)

(52) U.S. Cl.
CPC .......... *B81B 7/0048* (2013.01); *B81B 7/0061* (2013.01); *B81C 1/00325* (2013.01);
(Continued)

(58) Field of Classification Search
CPC ............ B81B 3/0018; B81B 2201/031; B81B 2201/02–0292; B81B 2201/0264;
(Continued)

(56) References Cited

U.S. PATENT DOCUMENTS 3,508,126 A  4/1970 Newman
3,952,265 A  4/1976 Hunsperger
(Continued)

FOREIGN PATENT DOCUMENTS

EP  1986297 A2  10/2008
EP  2490263 A2  8/2012
(Continued)

OTHER PUBLICATIONS

Cameron G. Clark, "The Basics of Arc Flash," GE Industrial Solutions web site accessed Oct. 5, 2016, http://apps.geindustrial.com/publibrary/checkout/ArcFlash4?TNR=White%20Papers%7CArcFlash4%7Cgeneric (3 pages).
(Continued)

*Primary Examiner* — Mary A Wilczewski
*Assistant Examiner* — Tsz K Chiu
(74) *Attorney, Agent, or Firm* — John R. Pessetto; Frank D. Cimino

(57) ABSTRACT

Described examples include sensor apparatus and integrated circuits having a package structure with an internal cavity and an opening that connects of the cavity with an ambient condition of an exterior of the package structure, and an electronic sensor structure mechanically supported by wires in the cavity and including a sensing surface exposed to the cavity to sense the ambient condition of an exterior of the package structure.

14 Claims, 9 Drawing Sheets

(51) Int. Cl.
*B81C 1/00* (2006.01)
*H01L 21/02* (2006.01)
*H01L 21/56* (2006.01)
*H01L 31/0203* (2014.01)

(52) U.S. Cl.
CPC .............. *B81B 2201/0264* (2013.01); *H01L 2224/05554* (2013.01); *H01L 2224/48091* (2013.01); *H01L 2224/48247* (2013.01); *H01L 2924/181* (2013.01)

(58) Field of Classification Search
CPC . G01N 27/129; H01L 23/4334; H01L 23/315; H01L 23/49541; H01L 23/3107; H01L 23/4951; H01L 23/49531; H01L 2224/48091; H01L 2224/48247; B81C 1/00325
See application file for complete search history.

(56) References Cited

U.S. PATENT DOCUMENTS

| | | |
|---|---|---|
| 4,007,978 A | 2/1977 | Holton |
| 4,210,923 A | 7/1980 | North et al. |
| 4,267,484 A | 5/1981 | O'Loughlin |
| 4,272,753 A | 6/1981 | Nicolay |
| 4,303,934 A | 12/1981 | Stitt |
| 4,757,210 A | 7/1988 | Bharat et al. |
| 4,891,730 A | 1/1990 | Saddow et al. |
| 4,916,506 A | 4/1990 | Gagnon |
| 4,942,456 A | 7/1990 | Sako |
| 4,996,577 A | 2/1991 | Kinzer |
| 5,340,993 A | 8/1994 | Salina et al. |
| 5,389,578 A | 2/1995 | Hodson et al. |
| 5,514,892 A | 5/1996 | Countryman et al. |
| 5,600,174 A * | 2/1997 | Reay .............. G01F 1/6845 257/470 |
| 5,629,838 A * | 5/1997 | Knight .............. H01L 23/642 361/734 |
| 5,796,570 A | 8/1998 | Mekdhanasarn |
| 5,929,514 A | 7/1999 | Yalamanchili |
| 5,990,519 A | 11/1999 | Huang-Lu et al. |
| 6,031,251 A | 2/2000 | Gempe et al. |
| 6,111,305 A | 8/2000 | Yoshida et al. |
| 6,242,987 B1 | 6/2001 | Schopf et al. |
| 6,300,632 B1 * | 10/2001 | Liu .............. G01J 5/06 250/336.1 |
| 6,351,011 B1 | 2/2002 | Whitney et al. |
| 6,359,276 B1 | 3/2002 | Tu |
| 6,365,433 B1 | 4/2002 | Hyoudo et al. |
| 6,507,264 B1 | 1/2003 | Whitney |
| 6,509,574 B2 | 1/2003 | Yuan et al. |
| 6,696,752 B2 | 2/2004 | Su et al. |
| 6,815,808 B2 | 11/2004 | Hyodo et al. |
| 6,821,822 B1 | 11/2004 | Sato |
| 6,921,704 B1 | 7/2005 | Wu et al. |
| 6,977,468 B1 | 12/2005 | Baginski |
| 7,015,587 B1 | 3/2006 | Poddar |
| 7,321,162 B1 | 1/2008 | Lee et al. |
| 7,334,326 B1 | 2/2008 | Huemoeller et al. |
| 7,436,054 B2 * | 10/2008 | Zhe .............. B81C 1/0023 257/686 |
| 7,732,892 B2 | 6/2010 | Jeng et al. |
| 7,749,797 B2 | 7/2010 | Bauer et al. |
| 7,842,542 B2 | 11/2010 | Shim et al. |
| 7,869,180 B2 | 1/2011 | Cheung et al. |
| 8,018,705 B2 | 9/2011 | Michalopoulos et al. |
| 8,159,056 B1 | 4/2012 | Kim et al. |
| 8,433,084 B2 * | 4/2013 | Conti .............. H04R 19/005 381/174 |
| 8,436,460 B1 | 5/2013 | Gamboa et al. |
| 8,569,082 B2 | 10/2013 | Kummerl et al. |
| 8,633,551 B1 * | 1/2014 | Teh .............. H01L 24/19 257/E25.001 |
| 9,006,857 B1 | 4/2015 | Carr |
| 9,129,826 B1 | 9/2015 | Lee |
| 9,160,423 B2 | 10/2015 | Brauchier |
| 9,184,012 B2 | 11/2015 | Wang |
| 9,219,028 B1 | 12/2015 | Higgins |
| 9,419,075 B1 | 8/2016 | Carothers et al. |
| 9,748,207 B2 | 8/2017 | Krause et al. |
| 9,754,848 B2 * | 9/2017 | Jun .............. H01L 23/10 |
| 9,761,543 B1 | 9/2017 | Male |
| 9,926,188 B2 * | 3/2018 | Classen .............. B81B 7/0048 |
| 9,929,110 B1 | 3/2018 | Male et al. |
| 10,002,700 B2 | 6/2018 | Lan et al. |
| 10,861,796 B2 | 12/2020 | Cook et al. |
| 2001/0032054 A1 * | 10/2001 | Kimoto .............. G01N 27/122 702/24 |
| 2003/0141802 A1 * | 7/2003 | Liebeskind .............. H01J 29/94 313/495 |
| 2003/0183916 A1 | 10/2003 | Heck et al. |
| 2003/0222205 A1 | 12/2003 | Shoji |
| 2004/0080025 A1 | 4/2004 | Kasahara et al. |
| 2004/0084729 A1 * | 5/2004 | Leung .............. H01L 23/62 257/360 |
| 2004/0111881 A1 | 6/2004 | Yang et al. |
| 2005/0170656 A1 * | 8/2005 | Nasiri .............. B81C 1/00238 438/700 |
| 2005/0179102 A1 * | 8/2005 | Weiblen .............. H01L 31/0203 257/435 |
| 2005/0218300 A1 | 10/2005 | Quinones et al. |
| 2005/0221517 A1 | 10/2005 | Speyer et al. |
| 2006/0063462 A1 * | 3/2006 | Ding .............. B81B 7/0038 445/24 |
| 2006/0087000 A1 | 4/2006 | Okuno |
| 2006/0205106 A1 * | 9/2006 | Fukuda .............. B81C 1/00246 438/52 |
| 2006/0281334 A1 | 12/2006 | Shin et al. |
| 2007/0076421 A1 | 4/2007 | Kogo |
| 2007/0108388 A1 * | 5/2007 | Lane .............. H01L 31/0203 250/353 |
| 2007/0138395 A1 | 6/2007 | Lane et al. |
| 2007/0152308 A1 | 7/2007 | Ha et al. |
| 2007/0158826 A1 | 7/2007 | Sakakibara |
| 2007/0229177 A1 | 10/2007 | Moriya |
| 2007/0278897 A1 * | 12/2007 | Ozaki .............. H03H 3/08 310/313 D |
| 2008/0217759 A1 | 9/2008 | Lin et al. |
| 2008/0227286 A1 | 9/2008 | Gaillard |
| 2008/0266730 A1 | 10/2008 | Viborg et al. |
| 2008/0290486 A1 | 11/2008 | Chen et al. |
| 2009/0052214 A1 * | 2/2009 | Edo .............. H01F 27/323 363/123 |
| 2009/0085191 A1 * | 4/2009 | Najafi .............. B81B 7/0058 257/698 |
| 2009/0114901 A1 * | 5/2009 | Xie .............. B82Y 10/00 257/14 |
| 2009/0115049 A1 | 5/2009 | Shiraishi et al. |
| 2009/0127638 A1 | 5/2009 | Kilger et al. |
| 2009/0261430 A1 * | 10/2009 | Suzuki .............. B81B 7/007 257/417 |
| 2010/0052082 A1 * | 3/2010 | Lee .............. B81B 7/0061 257/E29.001 |
| 2010/0187652 A1 | 7/2010 | Yang |
| 2010/0244234 A1 | 7/2010 | Sonobe et al. |
| 2010/0252923 A1 * | 10/2010 | Watanabe .............. H01L 23/13 257/737 |
| 2010/0284553 A1 * | 11/2010 | Conti .............. B81C 1/00158 381/174 |
| 2011/0061449 A1 * | 3/2011 | Yagi .............. G01J 5/20 73/49.2 |
| 2011/0084340 A1 | 4/2011 | Yuan et al. |
| 2011/0089540 A1 | 4/2011 | Drost et al. |
| 2011/0102005 A1 | 5/2011 | Feng et al. |
| 2011/0108747 A1 | 5/2011 | Liu |
| 2011/0220996 A1 | 9/2011 | Kutsukake et al. |
| 2011/0233790 A1 | 9/2011 | Bchir |
| 2011/0248374 A1 * | 10/2011 | Akin .............. G01J 5/024 257/470 |
| 2011/0316113 A1 | 12/2011 | Noda |

(56) References Cited

U.S. PATENT DOCUMENTS

| | | | |
|---|---|---|---|
| 2012/0142144 A1* | 6/2012 | Taheri | B81C 1/0023 438/107 |
| 2012/0153771 A1* | 6/2012 | Formosa | H04R 19/005 310/300 |
| 2012/0212925 A1 | 8/2012 | Zoellin | |
| 2012/0299127 A1* | 11/2012 | Fujii | B81B 7/02 257/415 |
| 2013/0001710 A1* | 1/2013 | Daneman | G02B 26/0833 257/415 |
| 2013/0128487 A1* | 5/2013 | Lo | H05K 3/30 361/813 |
| 2013/0134445 A1 | 5/2013 | Tarsa | |
| 2013/0168740 A1* | 7/2013 | Chen | B81C 1/00238 257/254 |
| 2013/0194057 A1* | 8/2013 | Ruby | H03H 9/172 310/343 |
| 2013/0313698 A1* | 11/2013 | Chen | H01L 23/4334 257/690 |
| 2013/0315533 A1 | 11/2013 | Tay et al. | |
| 2013/0320459 A1 | 12/2013 | Shue et al. | |
| 2013/0320548 A1 | 12/2013 | Carpenter et al. | |
| 2013/0322675 A1 | 12/2013 | Zoellin | |
| 2013/0329324 A1 | 12/2013 | Tziviskos et al. | |
| 2013/0336613 A1 | 12/2013 | Meade et al. | |
| 2014/0001632 A1 | 1/2014 | Uehling et al. | |
| 2014/0061840 A1 | 3/2014 | Oguri et al. | |
| 2014/0084396 A1* | 3/2014 | Jenkins | H04R 23/006 257/419 |
| 2014/0091909 A1 | 4/2014 | Smith et al. | |
| 2014/0260541 A1* | 9/2014 | Lakhotia | G01N 27/12 73/25.05 |
| 2014/0264905 A1 | 9/2014 | Lee et al. | |
| 2014/0298825 A1 | 10/2014 | Noshadi | |
| 2015/0004902 A1 | 1/2015 | Pigott | |
| 2015/0023523 A1* | 1/2015 | Elian | H04R 1/406 381/91 |
| 2015/0035091 A1* | 2/2015 | Ziglioli | H01L 24/97 438/51 |
| 2015/0069537 A1* | 3/2015 | Lo | G01L 19/0076 438/51 |
| 2015/0094875 A1 | 4/2015 | Duzly et al. | |
| 2015/0104895 A1* | 4/2015 | Cheng | B81B 7/02 438/51 |
| 2015/0175406 A1* | 6/2015 | Lin | B81B 7/007 257/415 |
| 2015/0180425 A1 | 6/2015 | Lukashevich | |
| 2015/0198493 A1* | 7/2015 | Kaelberer | B81B 3/0037 73/718 |
| 2015/0198551 A1* | 7/2015 | Jun | H01L 23/10 204/431 |
| 2015/0249043 A1* | 9/2015 | Elian | B29C 70/72 264/294 |
| 2015/0255693 A1 | 9/2015 | Baade et al. | |
| 2015/0344296 A1 | 12/2015 | Pahl | |
| 2015/0369681 A1* | 12/2015 | Imai | G01L 19/145 73/727 |
| 2015/0369682 A1* | 12/2015 | Nakajima | G01L 19/143 73/384 |
| 2015/0372034 A1 | 12/2015 | Chen et al. | |
| 2015/0380353 A1 | 12/2015 | Bauer et al. | |
| 2016/0003436 A1 | 1/2016 | Singer | |
| 2016/0013771 A1* | 1/2016 | Sridaran | H03H 9/08 219/209 |
| 2016/0029685 A1* | 2/2016 | Tang | H05B 6/707 426/573 |
| 2016/0049341 A1 | 2/2016 | Pontarollo et al. | |
| 2016/0064696 A1 | 3/2016 | Collier et al. | |
| 2016/0087034 A1 | 3/2016 | You et al. | |
| 2016/0090297 A1* | 3/2016 | Zhang | B81B 7/0048 257/417 |
| 2016/0100256 A1* | 4/2016 | Watson | B81B 7/0061 381/113 |
| 2016/0103082 A1 | 4/2016 | Kimura | |
| 2016/0167089 A1 | 6/2016 | Ng | |
| 2016/0209285 A1* | 7/2016 | Nakajima | G01L 19/0069 |
| 2016/0241953 A1* | 8/2016 | Elian | H04R 1/406 |
| 2016/0261941 A1* | 9/2016 | Brioschi | H04R 1/086 |
| 2017/0022049 A1* | 1/2017 | Chu | B81C 1/00269 |
| 2017/0040335 A1 | 2/2017 | Lim | |
| 2017/0047271 A1 | 2/2017 | Zapico | |
| 2017/0089789 A1* | 3/2017 | Kanemoto | G01L 19/02 |
| 2017/0134004 A1 | 5/2017 | Isozaki | |
| 2017/0275157 A1* | 9/2017 | Zhu | H01L 27/1207 |
| 2017/0330841 A1 | 11/2017 | Cook et al. | |
| 2018/0151796 A1* | 5/2018 | Akahane | H05K 1/115 |
| 2019/0198487 A1* | 6/2019 | Udrea | H01L 23/13 |
| 2020/0219790 A1* | 7/2020 | Uppal | H01L 24/17 |
| 2021/0336585 A1* | 10/2021 | Mares | H01L 23/42 |

FOREIGN PATENT DOCUMENTS

| | | |
|---|---|---|
| GB | 2521619 | 1/2015 |
| JP | 2010230655 A | 10/2010 |
| JP | 2010238731 A | 10/2010 |
| JP | 2010245337 A | 10/2010 |
| KR | 20170018165 A | 2/2017 |
| RU | 2169962 C2 | 6/2001 |
| RU | 2201017 C2 | 3/2003 |
| RU | 2263999 A | 7/2005 |

OTHER PUBLICATIONS

National Semiconductor Corporation, "Semiconductor Packaging Assembly Technology," National Semiconductor Corporation, Aug. 1999, pp. 1-8.

International Search Report for PCT/US2017/068997 mailed May 24, 2018.

Maloberti, F., "Layout of Analog CMOS Integrated Circuit, Part 2 Transistors and Basic Cells Layout," retrieved from http://ims.unipv.it/Courses/download/AIC/Layout02.pdf, dated Mar. 15, 2004 (38 pages).

Texas Instruments Product Brochure ISO7841x High-Performance, 8000-Vpk Reinforced Quad-Channel Digital Isolator, dated Nov. 2014 (37 pages).

Texas Instruments Application Report "The ISO72x Family of High-Speed Digital Isolators," SLLA198—Jan. 2006 (12 pages).

Texas Instruments Developers Guide "Digital Isolator Design Guide," SLLA284A, Jan. 2009 (19 pages).

Wikipedia article "3D Printing," retrieved from "http://en.wikipedia.org/w/index.php?title=3D_printing&oldid=624190184", dated Sep. 4, 2014 (35 pages).

OSRAM Opto Semiconductors GmbH, Oslon Compact (850nm), version 1.6, SFH 4710, dated Dec. 1, 2015 (13 pages).

International Search Report for PCT/US2017/031987 mailed Sep. 7, 2017.

International Search Report for PCT/US2017/068983 mailed May 17, 2018.

European Search Report for 17796774.2 mailed May 9, 2019.

Extended European Search Report for 17886649.7 mailed Jan. 8, 2020.

Office Action for European Patent Application No. 17796774.2, mailed Jul. 9, 2020, 8 pages.

Office Action received for EP Application No. 17796774.2 mailed on Apr. 19, 2022, 9 pages.

Extended European Search Report for 17886649.7 mailed Jan. 8, 2020, 7 pgs.

EU Search Report for Application No. 17796774.2-1212, mailed Jul. 9, 2020, 8 pgs.

International Search Report for PCT/US2017/031987 mailed Sep. 7, 2017, 2 pgs.

International Search Report for PCT/US2017/068983 mailed May 17, 2018, 3 pgs.

Search Report for European Patent Application No. 17796774.2-1212, date of search May 9, 2019, 2 pgs.

Supplementary Search Report for European Patent Application No. 17886649.7, Dec. 13, 2019, 1 pg.

(56) References Cited

OTHER PUBLICATIONS

Office Action for European Patent Application No. 17796774.2, mailed Jul. 9, 2020, 8 pgs.
Final Office Action in corresponding U.S. Appl. No. 17/115,734, dated May 10, 2024, 108 pgs.

* cited by examiner

ELECTRONIC SENSORS WITH SENSOR DIE IN PACKAGE STRUCTURE CAVITY

CROSS-REFERENCE TO RELATED APPLICATION

This application is a continuation of U.S. patent application Ser. No. 15/372,565 filed Dec. 8, 2016, the entirety of which is incorporated herein by reference.

BACKGROUND

Electronic pressure or vacuum sensors are used in a variety of applications, such as microphones, biomedical instrumentation, industrial, and automotive or laboratory vacuum sensing. Integrated circuit (IC) sensor devices can be attractive for applications in which bulky machined sensors are not able to perform, or are too large, or consume too much power. However, high quality IC Piezo electric or capacitive pressure sensors are typically expensive to manufacture and require large packages. Micro electro mechanical systems (MEMS) and other mechanical sensors sense material changes caused by stress placed on a membrane or other flexible element. Piezoelectric micro-machined ultrasonic transducers (PMUT) offer wide operating temperature ranges and extended product lifetime. Capacitive micro-machined ultrasonic transducers (CMUT) use a membrane or diaphragm with one plate of a capacitor mounted on the membrane and another suspended plate, where membrane deflection alters the distance between the plates causing a detectable change in capacitance. Capacitive sensors generally have more stability with respect to time and temperature compared with piezo resistors. Other micro-machined pressure sensors use silicon reed oscillators including a small paddle suspended by a thin silicon bridge which can be caused to oscillate, where the vibration amplitude is highly sensitive to pressure changes. Conventional electronic sensor technology often suffers from packaging and material mismatch stresses. Moreover, high-sensitivity applications require very small sensor gaps, and any stress due to material mismatch or mounting creates significant temperature coefficient (TC) and long term drift issues because of the stress-induced diaphragm deflection. In addition, any metal in the vicinity of the diaphragm can lead to pressure hysteresis. Metal and/or ceramic packages are often used in conjunction with various techniques to reduce stress, but these technologies add significant cost to production of the IC sensor.

SUMMARY

Sensor apparatus, integrated circuits (ICs) and fabrication techniques are described herein. Described examples include a package structure with an internal cavity and a semiconductor die or other electronic sensor structure supported by wires in the cavity, with a sensing surface exposed to the cavity. The package structure includes an opening that connects the cavity and the package exterior to allow the exposed sensor face to sense an ambient condition of the exterior of the package structure. Described example ICs include a leadframe structure and bond wires connected to electrical conductors of the leadframe structure, as well as a package structure enclosing portions of the leadframe structure and the bond wires. The package structure includes a cavity with an opening, and a semiconductor die disposed at least partially within the cavity. The bond wires are connected to bond pads of the die, and may provide exclusive mechanical support for the die within the cavity to reduce stress and other mechanical effects on the die. A sensor circuit is formed on or in the semiconductor die, and includes one or more sensing surfaces exposed to the cavity to sense the ambient condition of the IC exterior. Example methods are described for fabricating an electronic sensor, including mounting a semiconductor die to a leadframe structure using a sacrificial material, connecting bond wires between leadframe conductors and die bond pads, forming a sacrificial material over a sensing face of the semiconductor die, forming a package material over the semiconductor die, the bond wires and portions of the leadframe, sublimating the sacrificial material to create an internal cavity and to expose the die sensing face, and forming an opening to connect the cavity and an exterior of the a package structure.

DETAILED DESCRIPTION OF EXAMPLE EMBODIMENTS

Figure 1:
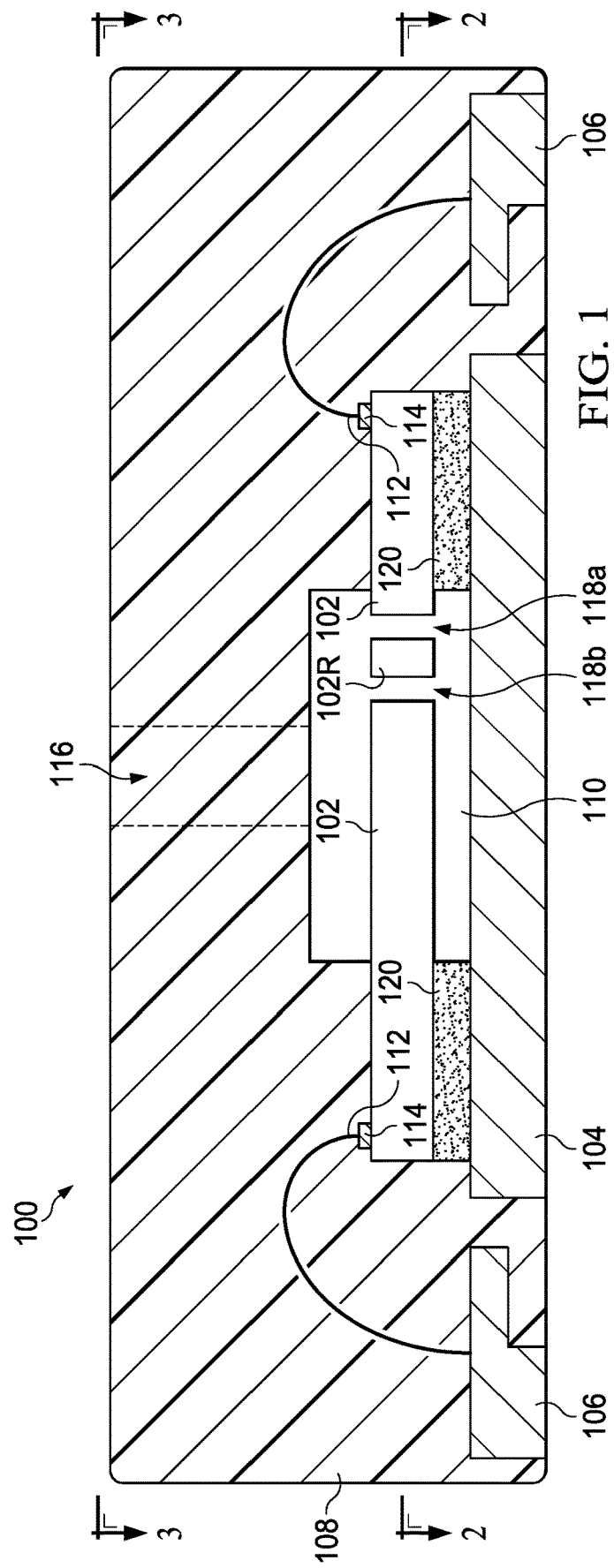
FIG. 1 is a sectional side elevation view of a sensor integrated circuit including a semiconductor die with a resistive sensor structure in an internal cavity according to an embodiment.

In the drawings, like reference numerals refer to like elements throughout, and the various features are not necessarily drawn to scale. In this description, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections.

Figure 2:
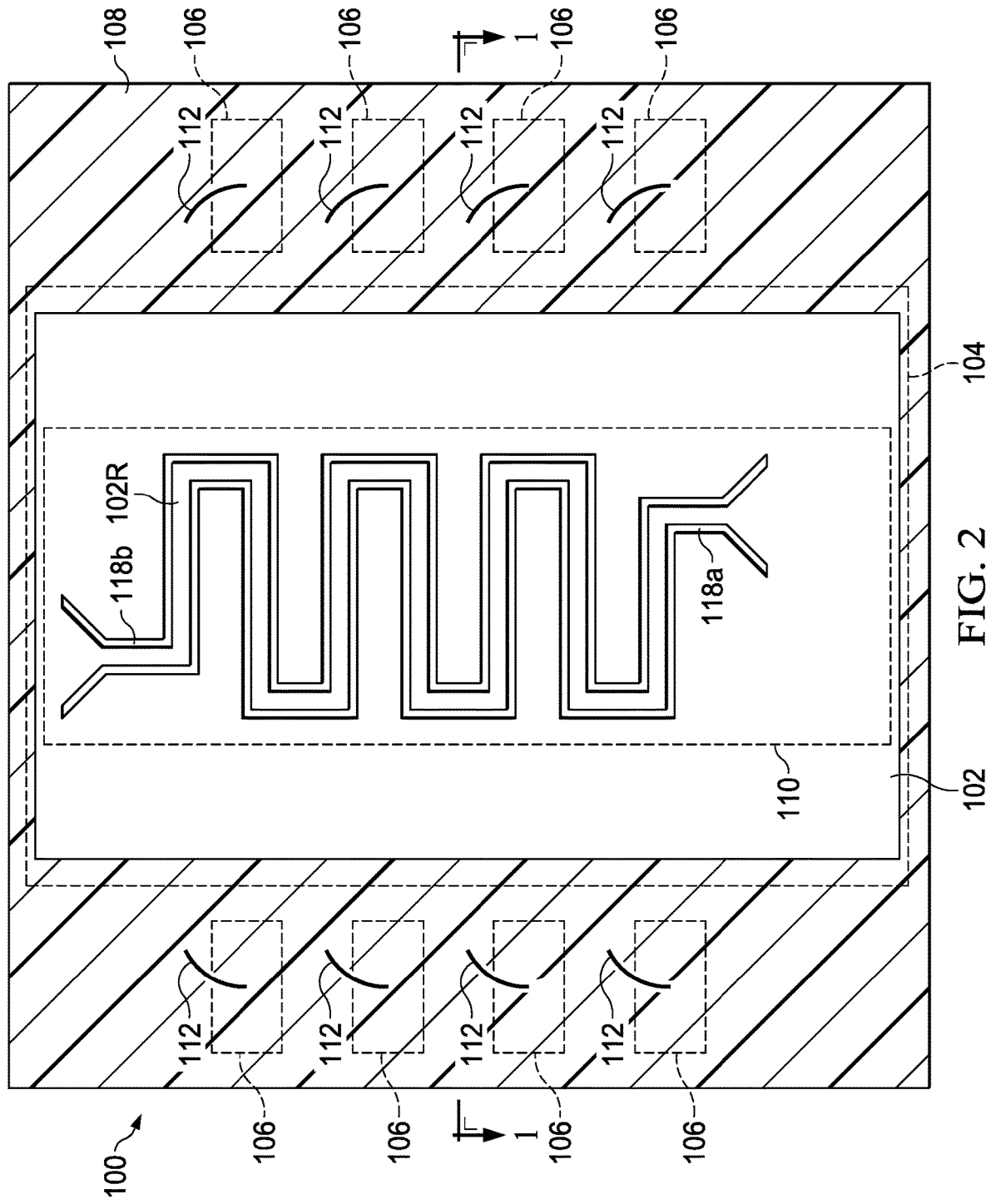
FIG. 2 is a sectional top view taken along line 2-2 of the integrated circuit in FIG. 1 showing a serpentine etched resistor structure.
Figure 3:
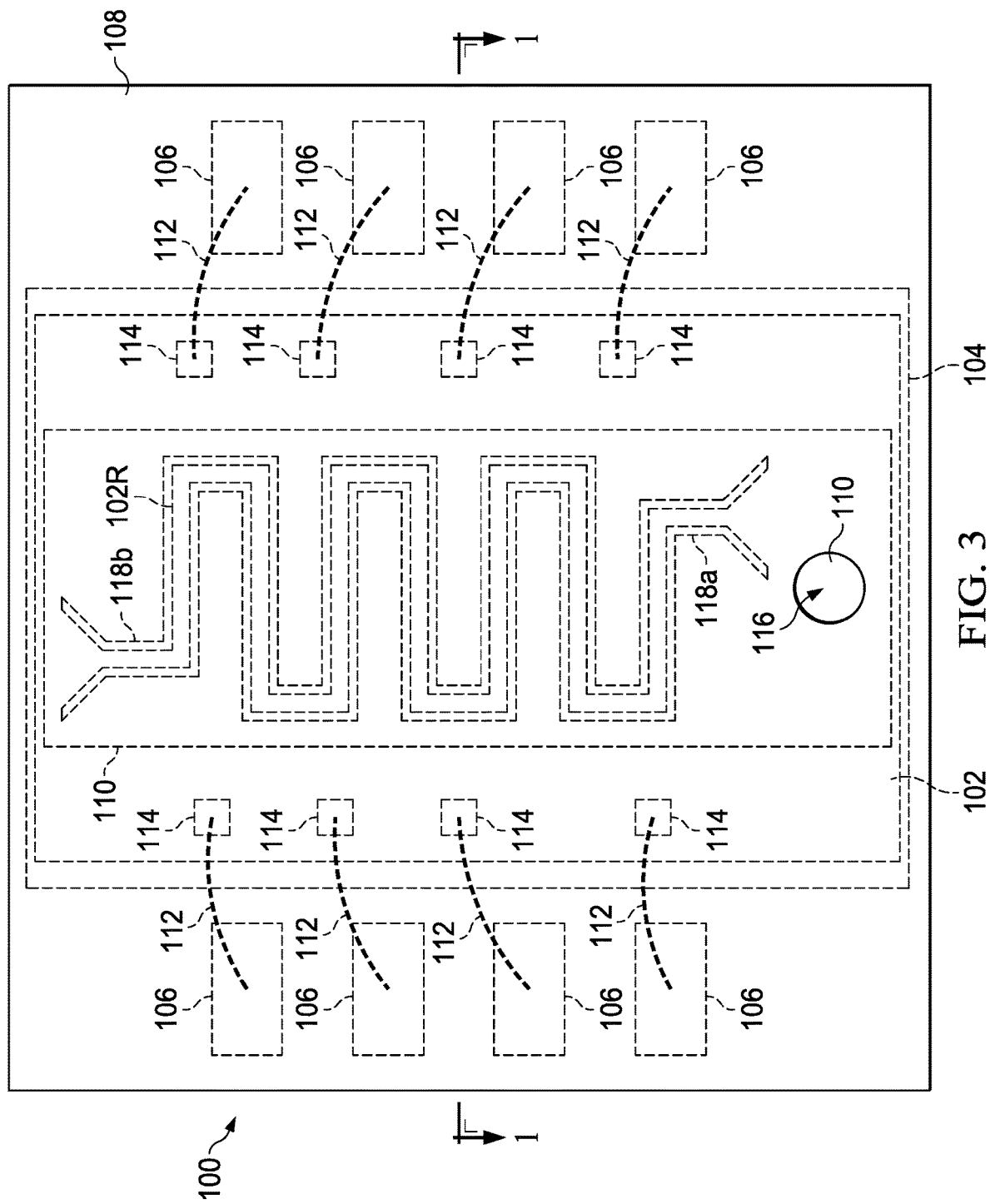
FIG. 3 is a top view of the integrated circuit of FIG. 1.

FIGS. 1-3 illustrate a sensor integrated circuit (IC) 100 including a semiconductor die 102 with a resistive sensor structure 102R in an internal cavity 110 of a package structure 108 according to one embodiment. In various embodiments, sensor circuitry and associated amplifiers, control circuits and interface circuits are fabricated in the semiconductor die 102 to interface sensing structures with external circuits, and a sensor output signal is provided to an externally accessible IC pad or pin 106 via a corresponding die pad 114 and bond wire 112 to indicate the sensed environmental condition, such as pressure, vacuum, etc. The cavity 110 is defined by an interior surface of the package structure 108, and an aperture, or port or opening 116 provides gas connection of the cavity 110 with an ambient condition of an exterior of the package structure 108. The die 102 provides an electronic sensor structure with an outer surface spaced from the interior surface in the cavity 110. The die 102 in one example is at least partially supported by bond wires 112 in the cavity 110. In the example of FIG. 1, the die 102 is also partially supported by one or more a die attach structures 120 extending between a base 104 (e.g., such as a die or chip paddle) of a leadframe structure and a portion of a bottom side of the substrate 102 proximate the lateral edge of the semiconductor die 102. In other examples, the die attach structure 120 can be laterally spaced from the die edge(s).

The electronic sensor structure 102 includes an upper sensing surface, in this case a top surface of the resistive sensor structure 102R that is exposed to the internal cavity 110 to sense the ambient condition of an exterior of the package structure 108. In one example, the resistor component 102R includes a top side exposed to the cavity 110, a bottom side exposed to the cavity 110, and one or both lateral sides exposed to the cavity 110 to sense a pressure condition of the exterior of the IC 100. The leadframe structure further includes electrical conductors 106, and the bond wires 112 are individually connected between one of the electrical conductors 106 of the leadframe structure and a corresponding bond pad 114 of the die 102. The package structure 108 encloses portions of the leadframe structure 104, 106 and the bond wires 112, and leaves portions of the electrical conductors 106 exposed as pins or pads of a finished IC 100 to allow soldering to a host circuit, not shown. The example of FIG. 1 is a surface mount IC 100 where the leadframe electrical conductors 106 have exposed planar bottom surfaces to allow soldering of the finished IC to corresponding pads of a host printed circuit board (PCB, not shown) for electrical connection to the die 102. Leaded surface-mount packages and leaded through-hole packages could also be used.

The package structure 108 can be formed by molding or other suitable process, preferably using an electrical insulator material. Described examples use a sublimation process to provide low-cost pressure or vacuum sensors using the semiconductor die 102 as the sensor element and also optionally for signal processing and other supporting circuitry. The semiconductor die 102 is encapsulated in the molded package structure 108 including sublimation die coat or other sacrificial material, and then baked to sublimate (e.g., evaporate) the sacrificial material, leaving the internal cavity 110 in which the die 102, or at least a portion thereof, is not touching the mold compound 108. The opening 116 is drilled or cast into the package structure 108 such that the external environment being sensed couples directly to the exposed sense surface of the die 102. In various examples, the opening 116 can be cast into the package structure 108 via a mold sprue, or the opening 116 can be incorporated into the package before the molding process via a disposable plug, or drilled into the package 108 after molding using mechanical drilling, laser drilling, etching or other techniques.

Sacrificial sublimation material can also be used under the die 102 (e.g., in between die attach structures 120, or under the die 102 to provide full stress isolation of the die 102 from the package structure 108 and from the leadframe base 104. The described sensor ICs 100 provides a low cost electronic sensor solution compared with other MEMs sensors. Other advantages include small package size, mitigation of the use of ceramics or metal IC package materials, and the ability to use ordinary mainstream manufacturing processing steps and equipment. In addition, the described examples facilitate high quality sensing capabilities and long device life.

The IC 100 includes a sensor circuit, in one example including the resistive sensor structure 102R formed on or in the semiconductor die 102. As shown in FIG. 1, the top, lateral sides, and bottom of the resistive structure 102R provide sensing surfaces exposed to the cavity 110 to sense the ambient condition of the IC exterior. In one example, the structure 102 is configured to sense a pressure of the exterior of the package structure 108. Although example in FIG. 1 is a pressure or vacuum sensor IC 100, various different types of sensors can be constructed using the described techniques and examples, including without limitation moisture or dew-point sensors, ion sensors, ph sensors, gas flow-rate sensors, fluid flow-rate sensors, radiation sensors, pressure sensors, and/or vacuum sensors as shown. In addition, different IC techniques and circuits can be used to sense properties of a gas in other embodiments, such as conductivity between exposed electrodes, by applying current and measuring a voltage; applying a voltage and measuring a current, or applying a voltage to a capacitor and measuring a decay time, etc.

In certain example, the die 102 includes a substrate, such as silicon, SOI, or other semiconductor substrate, and the sensor circuitry is formed on or in the substrate 101 using known semiconductor fabrication processes and equipment. The package structure 108 in one example is a molded structure. The package structure 108 can be any suitable molding material that provides electrical insulation and mechanical protection for the die 102, and can include low modulus of elasticity material to enhance stress immunity. The described thermal and mechanical isolation techniques and concepts allow use of package materials 108 that have a high coefficient of thermal expansion (CTE) and high thermal conductivity to save cost, while providing temperature stabilized operation, and mechanical isolation of the sensor circuitry. The die 102 can be supported in any suitable manner within the cavity 110. In addition, at least a portion of the outer surface of the semiconductor die 102 is spaced from the interior surface of the package structure cavity 110. Moreover, the die 102 separated from the package material 108 so as to be mechanically isolated from package stresses, thereby facilitating measurement of pressure or other environmental conditions inside the ported cavity 110. In other examples, part of the surface of the die 102 can be in contact with the interior surface of the package structure 108 in the cavity 110, or in contact with support structures, etc. (e.g., the die attach structures 120 in FIG. 1, where included).

In certain examples, such as where the die attach structures 120 in FIG. 1 are omitted, the die 102 is suspended (e.g., mechanically supported exclusively) by the bond wires 112 that extend from the leadframe conductive structures 106 into the internal cavity 110. The bond wires 112 are soldered or welded to bond pads 114 on the top of the semiconductor die 102 to form electrical connection between the bond pads 114 and the associated leadframe conductive structures 106 prior to a molding process to form the package material 108. The cavity 110 is created by sublimation or evaporation of a sacrificial sublimation material formed during intermediate fabrication processing, and the port or opening 116 can be created as part of a molding process, or can be later drilled or machined through the molded material 108. The port 116 can be used to facilitate fabrication of the suspended die structure 102 using sublimation materials or other sacrificial materials that are thermally evaporated or sublimated after formation of the molded structure 108 to leave the die 102 at least in part, by the bond wires 112 as shown in FIG. 1. Suitable fabrication processes and materials are illustrated and described in U.S. patent application Ser. No. 15/248,151, filed Aug. 26, 2016, and entitled "Floating Die Package", the entirety of which is hereby incorporated by reference.

The cavity 110 in one example is formed by depositing a sacrificial encapsulant material over the semiconductor die 102 prior to molding, and heating to cause sublimation of the sacrificial encapsulant material through the port 116 of the molding structure 116. This process leaves a space in which the semiconductor die 102 is disposed floating over the leadframe base 104 (completely separated from the base 104 where the die attach structures 120 are omitted, or a space or gap is formed between the lower surface of the resistive structure 102R and the top surface of the base structure 104 as shown in FIG. 1 where one or more die attach structures 120 are included). The open spaces of the cavity 120 are thus formed by sublimation or shrinkage/delamination of a sacrificial material deposited between the die 102 and the base 104, and on the sensed face of the die structure 102 prior to the sublimation thermal process. The separation or spacing of the outer surface of the die 102 from the interior surface of the molded material 108 in certain examples provides a gap for thermal and/or mechanical isolation on all sides of the die 102, leaving the bond wires 112 as the only significant thermal conduction path and mechanical support structure relative to the outside environment. In certain embodiments, the diameter, length, location and quantity of the bond wires 112 maintain the die in a fixed position in the cavity 110. This approach enables efficient temperature management of just the silicon die, while eliminating most of the parametric electrical drifts due to mechanical stress and hysteresis of existing approaches.

Described examples facilitate low-cost packaging of electronic sensors in molded packages using a conducting leadframe and insulating over-mold with a port or cavity 116 so that the IC can be coupled to an environment (for example: gas or fluid.) such that the gas being sensed is in direct contact with the top of the die 102, or the sensing face of the die 102 can be exposed to the cavity interior through a thin material layer, such as a passivation layer (e.g., FIG. 13 below). This provides many advantages compared with sensor circuits packaged in expensive, ceramic or machined metal packages. Any suitable sacrificial material can be used in forming the cavity 110, which will vaporize or sublimate when heated, leaving an open cavity 110 around all or at least a portion of the semiconductor die 102.

Referring also to FIGS. 2 and 3, the IC 100 of FIG. 1 in one example implements a Pirani vacuum sensor using an etched, serpentine resistor structure 102R formed of semiconductor material (e.g., silicon) of the die 102. In this sensor, the resistor structure 102R is incorporated in the IC and powered by circuitry detailed in FIGS. 4 and 5 below. The resistor temperature will increase as a function of the applied power and heat conductivity of the materials. With an isolated IC, the rate of cooling is related to the number of gas atoms around the IC (level of vacuum). In this manner, the sensor IC 100 can measure pressure and/or vacuum of the ambient at the exterior of the IC 100. Conventional IC processes deposit resistive materials over silicon, silicon dioxide, or silicon nitride. Silicon dioxide is a better thermal insulator than silicon, but still conducts heat. As shown in FIG. 2, the resistive structure 102R is a portion of the semiconductor substrate 102 with trenches or gaps 118a and 118b formed on lateral sides of the remaining substrate portion 102R. In this example, the trench-isolated resistive structure 102R is essentially suspended between first and second ends, by which the center portion of the resistive structure 102R includes an exposed top, and exposed bottom, and first and second exposed lateral sides within the cavity 110. Using trench etching allows the resistor to be even further thermally insulated from the IC bulk, producing a Pirani Vacuum sensor. In an alternate implementation, the resistor could be made from a wire or other separate element suspended above the die 102, such as a bond wire or resistance wire. The serpentine resistive element 102R in FIGS. 1-3 is thermally decoupled from the surrounding silicon and packaging by the trenches 118a and 118b and placement of sublimation material above and below it during fabrication leaves the cavity surrounding the surfaces of the structure 102R. In operation, thermal flux from the serpentine resistor structure 102R to the surrounding silicon walls has a magnitude that is a function of the gas density of the environment being sensed. High thermal flux is manifested as a drop in the serpentine resistor temperature. The presence of the die attach structures 120 in the illustrated embodiment advantageously provides structural support and mechanical attachment through the structures 120 to the lead frame structure 104 such that the outer portions of the structure 102 remain at a somewhat constant ambient temperature. As further shown in FIGS. 1 and 3, the port or opening 116 extends from the top surface of the package structure 108 to the cavity 110. In other examples, a serpentine structure is not needed, and the plan view profile can be straight, curved, curvilinear or any other shape to implement a resistor structure 102R.

The trench regions 118 are formed by etching or cutting regions 118a and 118b of silicon away from top to bottom of the semiconductor substrate, leaving a resistant element or structure 102R. In operation of the sensor IC 100, a voltage or current signal is applied to the resistor structure 102R, and thermal exchange between that heated element 102R and its exterior can be used to measure the level of vacuum in that region. This example provides an inexpensive vacuum sensor IC 100, in which a current is passed through the resistor structure 102R, and the resistance of the structure 102R is measured while it is being heated. The thermal conductivity between the structure 102R and the region above, below and laterally alongside the structure 102R is a function of the gas in the cavity 110. The thermal loss of the heated structure 102R is a function of the amount of vacuum in the cavity 110, and the resistance of the structure 102R will change based on the vacuum level.

Figure 4:
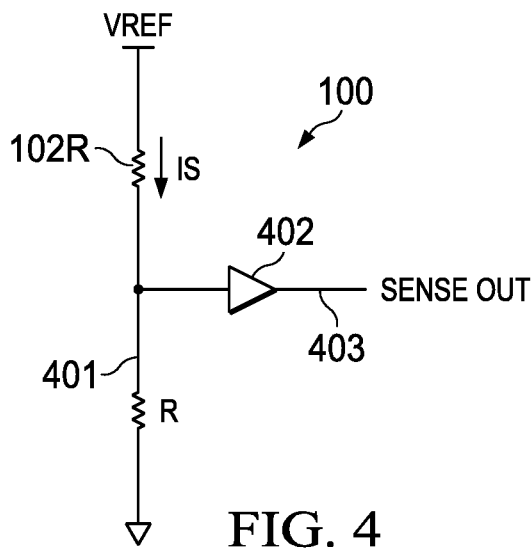
FIG. 4 is a schematic diagram showing interface circuitry to measure a current flowing in the resistor structure of the integrated circuit of FIG. 1.
Figure 5:
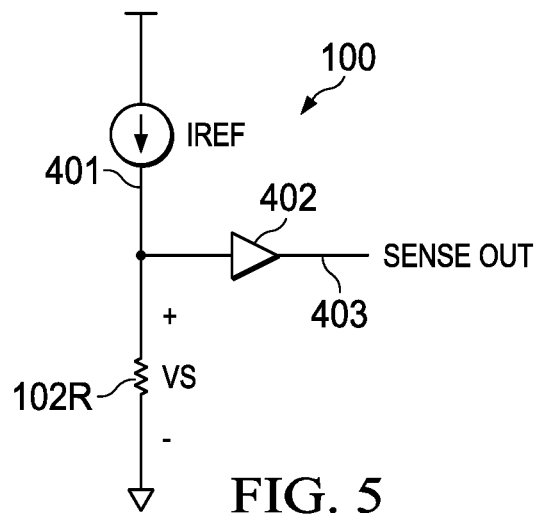
FIG. 5 is a schematic diagram showing interface circuitry to measure voltage across the resistor structure of the integrated circuit of FIG. 1.

As further shown in FIGS. 4 and 5, the resistor structure 102R is incorporated into the die 102 and powered by a reference voltage VREF (FIG. 4) or a reference current IREF (FIG. 5). In various examples, the amplifier 402 provides a sensor output according to a voltage or a current of the resistor component 102R. FIG. 4 shows an interface circuit example including the sense resistor structure 102R along with a second resistor R and an amplifier 402 constructed on or in the semiconductor die 102. The resistors 102R and R are connected in series between a voltage signal source VREF and a reference node. The amplifier 402 has an input 401 connected to a node joining the resistors 102R and R to receive a voltage signal representing a current IS flowing in the sensor resistor structure 102R. The amplifier 402 includes an output 403 providing a sensor output signal SENSE OUT representing the sense resistor current IS. FIG. 5 shows another example including a current source IREF providing a current signal to the resistor structure 102R. In this case, the amplifier 402 measures a voltage VS across the resistor structure 102R and provides the sensor output signal SENSE OUT at the output 403. In the sensor IC example 100 of FIGS. 1-5, the temperature of the resistor structure 102R increases as a function of the applied power and heat conductivity of the materials. With an isolated IC, the rate of cooling is related to the number of gas atoms around the IC (level of vacuum), and the sensor output signal SENSE OUT represents the vacuum level ambient condition of the exterior of the IC 100.

FIGS. 6-11 show another sensor integrated circuit example 600 fabricated using sublimation of sacrificial die attach material and advanced etching to implement an electronic sensor. The sensor IC 600 in this example provides a capacitive membrane or diaphragm sensor structure in the cavity 110 of the package structure 108. The electronic sensor structure 600 can be used in a variety of applications to measure pressure, and in certain examples can be used as a microphone configured to respond to an acoustic wave on the exterior of the molded package structure. The IC structures including the packaging material 108, the leadframe structure 104, 106, the cavity 110, the port or opening 116, the bond wires 112 and the bond pads 114 are generally as described above. The sensor IC 600 in FIG. 6 includes a semiconductor die assembly 605, with a first semiconductor substrate 601 and a second semiconductor substrate 602. A first dielectric layer 603 is formed over a portion of a first side of the first semiconductor substrate 601. The second semiconductor substrate 602 includes a first side (shown as the top side in FIG. 6), and a lower second side. The substrate 602 also includes an annular first portion with a top side and a bottom side, where the bottom side of the first portion 602 is in contact with the first dielectric layer 603. In addition, the second substrate 602 includes an inner second portion 602D providing a diaphragm. The inner portion 602D includes a top or upper first side, and a lower second side. The diaphragm or second portion 602D in this example is laterally inwardly spaced from the annular first portion 602. In certain examples, the annular portion 602 and the diaphragm portion 602D can be generally circular, but other shapes can be used. In this example, moreover, the lower second side of the second portion 602D is vertically spaced from the first dielectric layer 603 in order to form a pressure sensor diaphragm that is laterally spaced from the annular first portion 602. This structure provides a capacitive membrane or diaphragm sensor structure in an internal cavity. As schematically shown in dashed lines in FIG. 6, the second portion 602D of the second semiconductor substrate forms a capacitor C including a first capacitor plate disposed above a second capacitor plate formed by the exposed upper first side of the first semiconductor substrate 601. The gap or void beneath the diaphragm portion 602D is evacuated during fabrication in one example to facilitate use as an absolute pressure sensor.

Interface circuitry (not shown) is fabricated in the annular portion 602 of the second substrate in one example to convert capacitance of the structure to a usable signal (e.g., voltage or current). In one example, the majority of the annular portion 602 and base portion 601 are operated at a ground or reference potential, and the second portion 602D is connected to the interface circuit. The active portion 602D of the capacitive element in this example is essentially buried in the die assembly 605, and is not subject to surface leakage issues (e.g., isolated by oxides). In certain examples, a Faraday structure is provided by a polysilicon grid (not shown) formed over the diaphragm 602D at the same potential as the diaphragm 602D. This allows or facilitates cancellation of parasitic capacitance changes caused by the sensed medium or contamination of the interior of the cavity 110 of the sensor IC 600.

Figure 7:
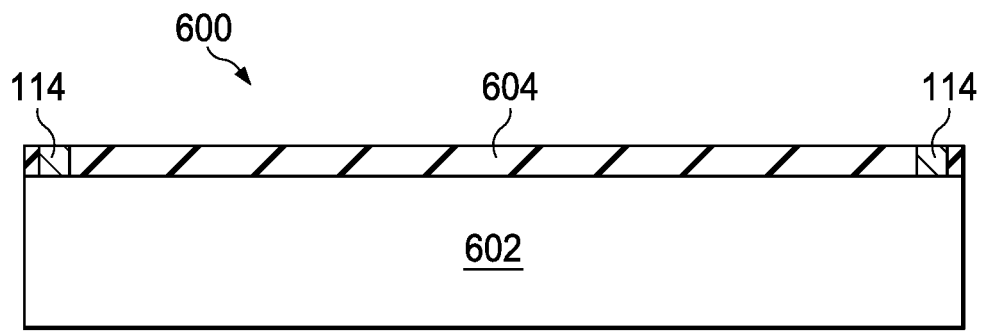
FIGS. 7-11 are partial sectional side views of the integrated circuit of FIG. 6 at successive intermediate stages of fabrication.
Figure 8:
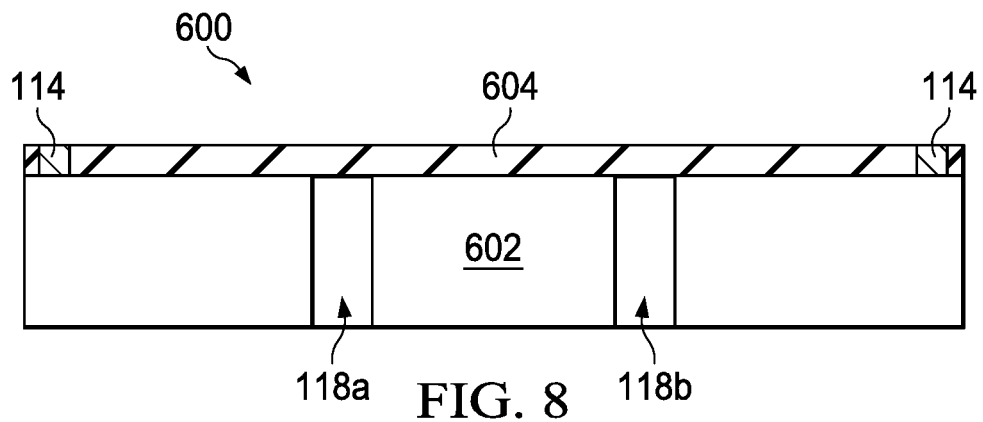
Figure 10:
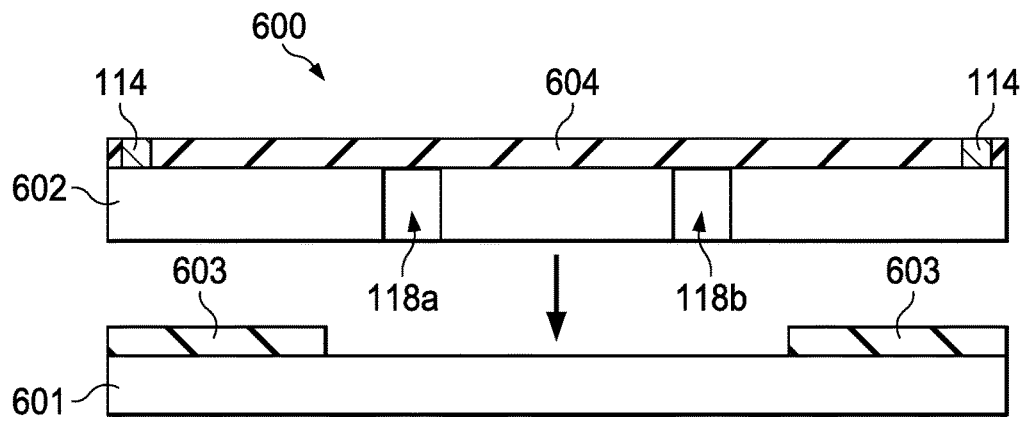

FIGS. 7-11 illustrate the sensor IC 600 at successive intermediate stages of fabrication. In FIG. 7, the upper (e.g., second) semiconductor substrate 602 is shown, with an inter-metal dielectric (IMD) layer 604 formed on the upper or first side of the substrate 602. As previously mentioned, interface circuitry and other components are formed on and/or in the substrate 602 (not shown). In addition, bond pads 114 are formed on the upper side of the structure, extending through the dielectric material 604 to the top side of the substrate 602. In FIG. 8, a backside edge is used to form the trenches or openings 118a and 118b, extending from the bottom or second side of the second substrate 602 to the bottom of the IMD layer 604. In certain examples, the trenches 118 can be backfilled with sacrificial sublimation material (not shown), and the lower side of the structure can be backgrounded and polished to a desired thickness (e.g., 4 mm), after which the trench material can be removed, leaving the structure shown in FIG. 9. As shown in FIG. 10, the first dielectric layer 603 is formed on the laterally outward portions of the upper or first side of the first semiconductor substrate 601, with a central portion of the upper side exposed (i.e., not covered by the dielectric 603).

Figure 11:
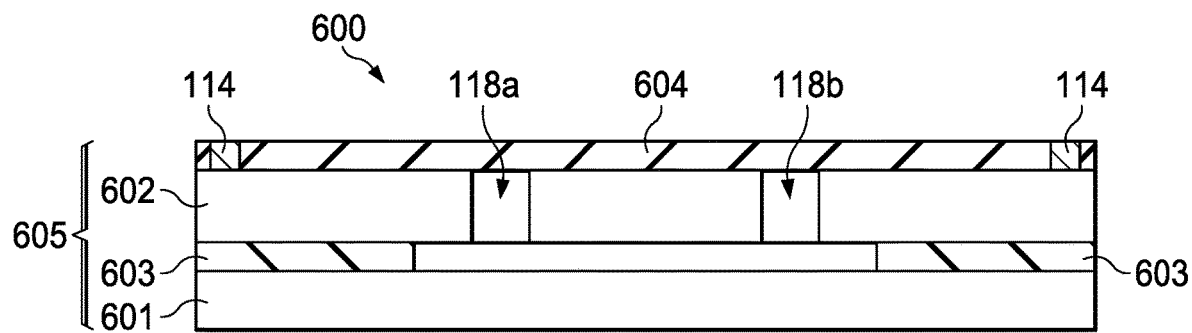

The two structures are bonded to one another in the direction shown by the arrow in FIG. 10, to provide a dual-substrate semiconductor die structure 605 as shown in FIG. 11. Any suitable substrate bonding techniques and materials can be used to form the resulting die structure 605. In one example, the semiconductor (e.g., silicon) material 602 is bonded to the dielectric material 603 in FIG. 10 in a vacuum, under a bias voltage and at high temperature to create a high integrity, low leakage bond that encloses the lower side of the sensor diaphragm 602D in a vacuum for the sensor IC 600. In one example, this is the reference vacuum for an absolute pressure sensor. The dielectric bonding approach in one example seals this reference vacuum permanently between the two capacitor plates.

Figure 6:
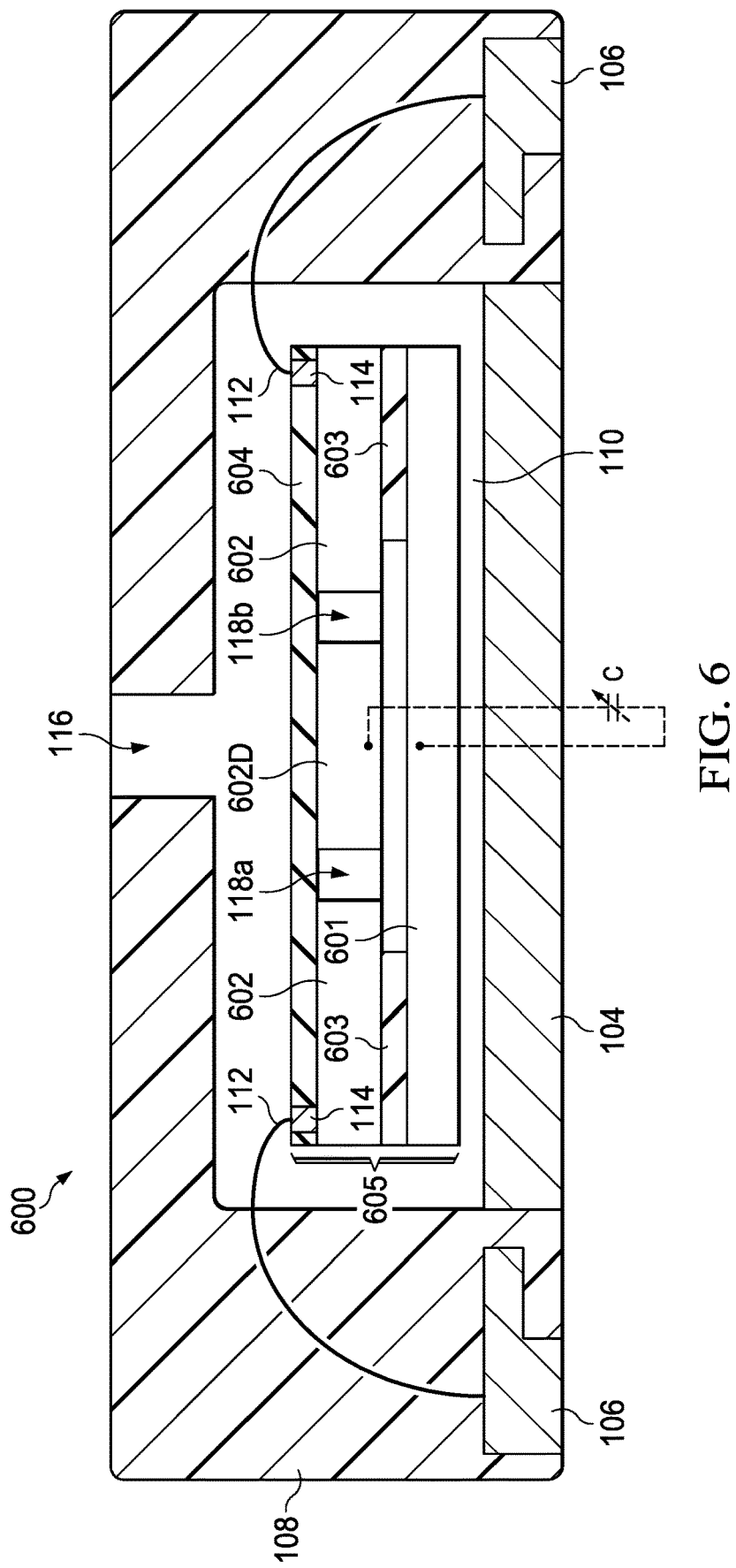
FIG. 6 is a sectional side elevation view of another sensor integrated circuit embodiment including a semiconductor die with a capacitive membrane or diaphragm sensor structure in an internal cavity.
Figure 9:
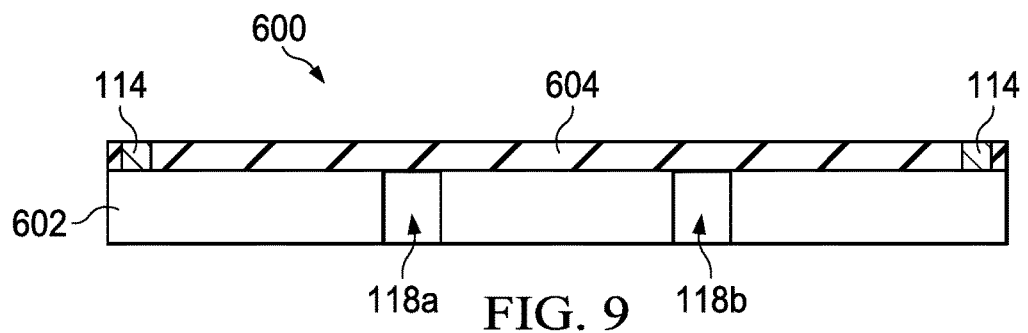

As previously mentioned, the die 605 can then be mounted to the leadframe structure 104, 106 using a sacrificial die attach material (not shown) and wire bonding is used to connect bond wires 112 from the die pads 114 two associated electrical conductors 106 of the leadframe structure. Thereafter, additional sacrificial sublimation material is formed on the lateral sides and upper surface of the die 605, and the molded package structure 108 is formed through a molding or other suitable process. The resulting structure is then heated in order to evaporate or sublimate the sacrificial material, leaving the cavity 110 with the dual-substrate die structure 605 suspended through mechanical support provided by the soldered or welded bond wires 112. One of the challenges in conventional semiconductor sensors is mechanical stress applied to the sensor through the package structure 108 and a support or pedestal mechanically connected to the base substrate. Such mechanical configuration can introduce significant stress due to temperature expansion differences in the materials which causes deflection of the diaphragm structure. In the described examples, this mechanical coupling is avoided, and the dual-substrate die structure 605 can be mechanically supported exclusively by the bond wires 112 inside the cavity 110 of the molded package structure 108. The resulting sensor IC structure 600 shown in FIG. 6 is substantially free of all of the stresses introduced by the package and by the mold compound 108, by anything around it and the opening 116 provides the ability to couple external atmosphere to the sensing face at the top of the dielectric layer 604 above the diaphragm structure 602D.

Figure 12:
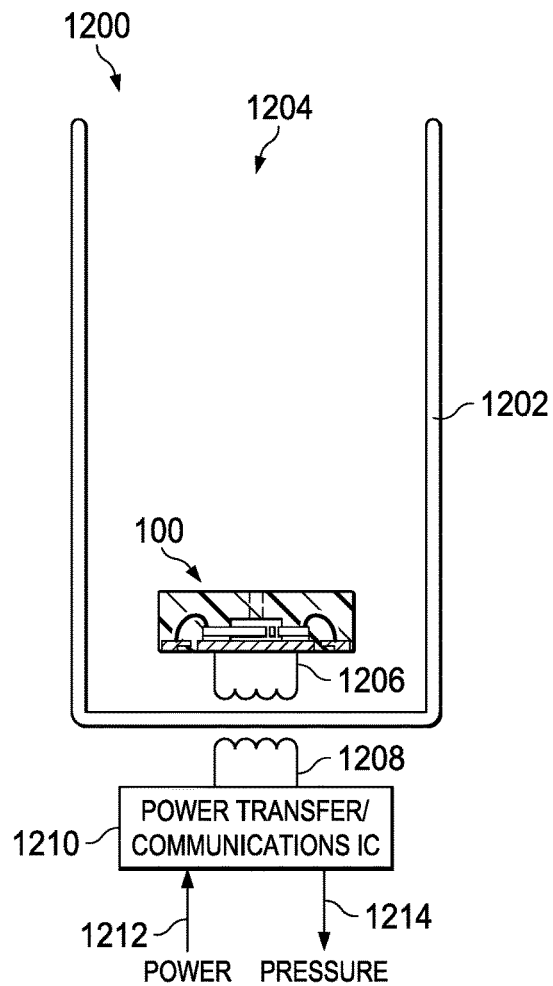
FIG. 12 is a sectional side view of a resistive pressure sensor with a coil to receive power or to transmit data for wireless interface through a containing tube.

FIG. 12 shows a pressure sensor 100 as described above in connection with FIGS. 1-5 in a system 1200 with a containing tube 1202. In the example of FIG. 12, the sensor IC 100 further includes a coil 1206 to receive power and/or to transmit data. In one implementation, the sensor IC 100 includes a single transformer coil to transfer both power and data, although other implementations are possible that include separate, integrated power and data transformer coils (only a single coil 1206 is shown in FIG. 12). The power and/or data is transformer coupled to a corresponding single or multiple secondary coils 1208 provided with a power transfer and/or communications IC 1210. In these arrangements, power can be provided in the direction 1212 from an external source to the sensor IC 100, and data from the sensor IC 100 can be wirelessly provided to the external IC 1210 in order to provide sensed pressure signals or values in the direction 1214 in FIG. 12. This facilitates sensing within a controlled tube or chamber 1202 in order to provide pressure readings regarding a pressure condition in the interior 1204 of the tube or enclosure 1202. Although illustrated in use within open ended tube 1202, a sealed enclosure can be used in other applications, with a hermetically sealed interior 1204. In this case, the sensor IC 100 wirelessly receives power and provides sensor data through the transformer coupling of the coils 1206 and 1208. In other embodiments, the wireless power and/or data exchange concepts of the example of FIG. 12 can be used in implementing the other sensor types shown and described herein.

Figure 14:
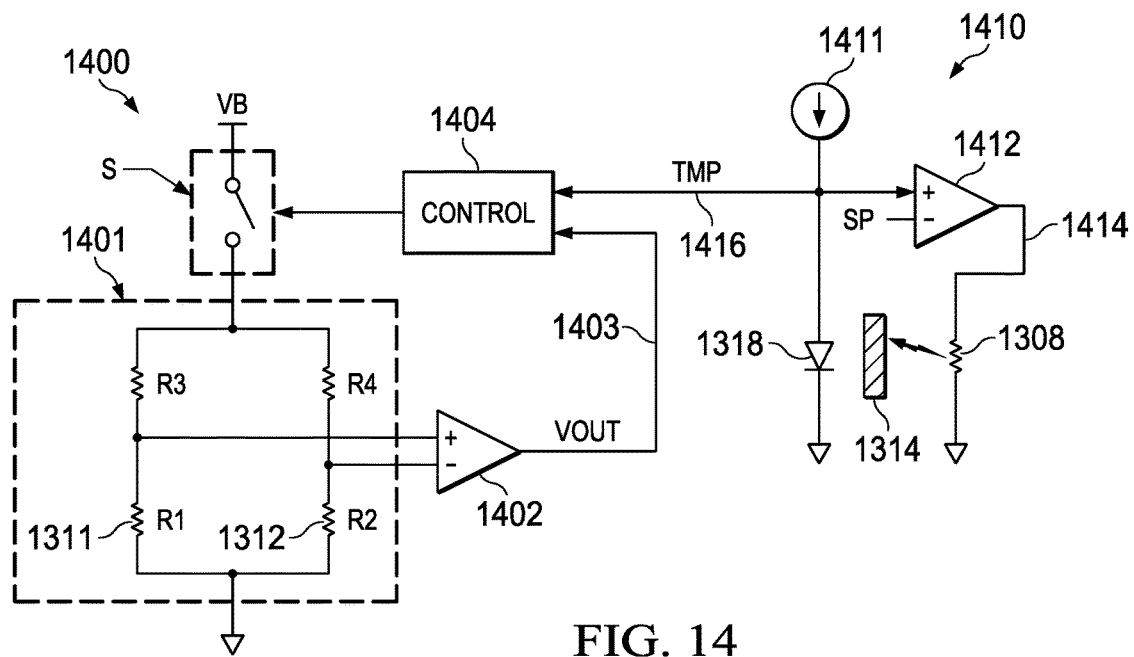
FIG. 14 is a schematic diagram showing a control circuit, a temperature regulation circuit, and a bridge circuit in the integrated circuit of FIG. 13.
Figure 13:
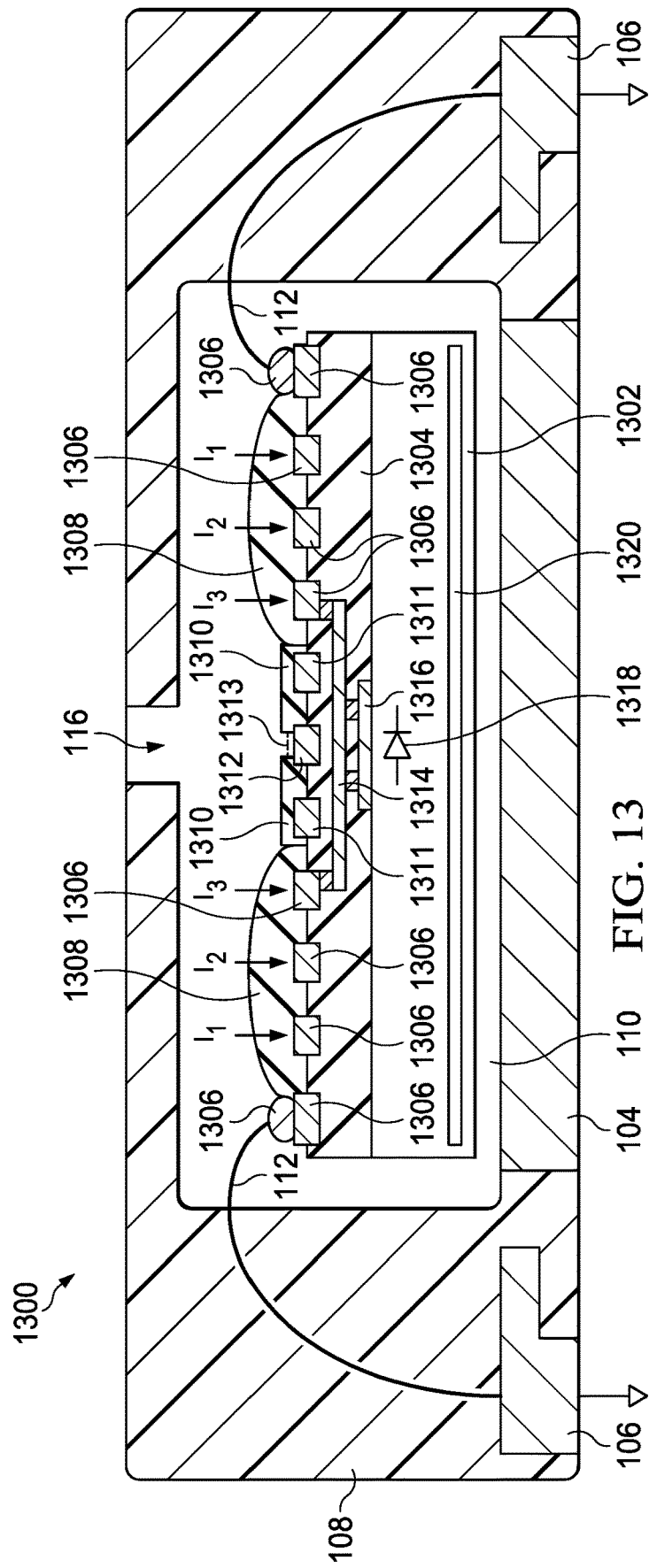
FIG. 13 is a sectional side view of another pressure sensor integrated circuit embodiment including a semiconductor die with a resistive bridge including a temperature controlled first resistor and a second resistor with a sensing face exposed to the interior cavity.
Figure 15:
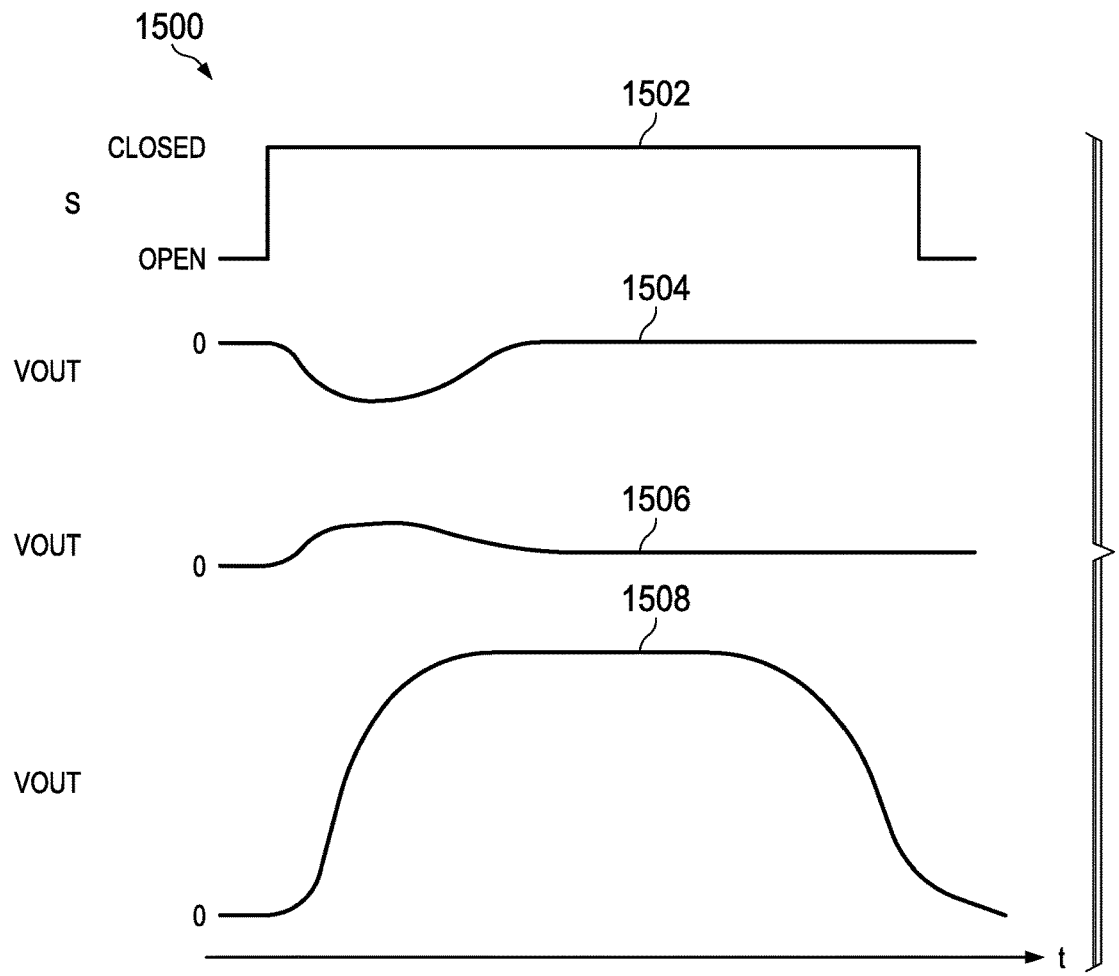
FIG. 15 is a signal diagram showing controlled bridge excitation and sensor output voltage signals in the sensor of FIGS. 13 and 14.

Referring now to FIGS. 13-15, FIG. 13 shows another sensor integrated circuit example 1300, used to measure gas dew point, which includes a semiconductor die 1302 with a resistive bridge circuit including a temperature controlled first resistor 1311 and a second resistor 1312 with a sensing face exposed to the interior cavity 110. FIG. 14 illustrates a control circuit 1404, a temperature regulation circuit 1410, and a bridge circuit 1401 in the IC 1300 of FIG. 13, and a signal diagram 1500 and FIG. 15 shows a controlled bridge excitation signal waveform 1502 along with sensor output voltage signal waveforms 1504, 1506 and 1508 in the sensor 1300 of FIGS. 13 and 14. The various schematically illustrated components (e.g., FIG. 14) are fabricated on and/or in the semiconductor die 1302 in one example. The IC 1300 in FIG. 13 provides a mechanically isolated semiconductor die 1302 in the illustrated a package structure cavity 110 to implement a dewpoint sensor or humidity sensor. The IC structures including the packaging material 108, the leadframe structure 104, 106, the cavity 110, the port or opening 116, the bond wires 112 and the bond pads 114 are generally as described above. In addition, the example of FIG. 13 includes a semiconductor die including a substrate 1302 (e.g., silicon), with an upper metallization structure including one or more dielectric material (e.g., IMD) layers 1304 with conductive metal structures. In addition, the illustrated example includes an n-doped buried layer (NBL) 1320 formed proximate the lower side of the silicon substrate 1302, and a temperature sensing diode 1318 is formed in an upper region of the semiconductor substrate 1302.

The first resistor structure 1311 in one example is an elongated generally annular structure of suitable metal or other resistive material formed on or in an upper surface of the IMD dielectric material 1304. In one example, the resistive material as a significant resistive temperature coefficient and is preferably close to the surface. A first passivation layer 1310 of a first thickness or height is formed over the first resistor structure 1311 between the first resistor structure 1311 and the cavity 110. In this manner, the first resistor structure 1311 is substantially hermetically isolated from the ambient environment in the cavity 110. The second resistor structure 1312 can also be formed using suitable metal or other resistive material on or in a portion of the upper surface of the dielectric material 1304, and laterally spaced from the annular first resistor structure 1311. All or a portion of the second resistor structure 1312 is completely or at least partially uncovered in the cavity 110. In certain examples, no overlying material is formed over at least a portion of the top surface of the second resistor structure 1312. In other possible implementations, a second passivation layer 1313 formed between the second resistor structure 1312 and the cavity 110, wherein the second passivation layer 1313 is thinner than the first passivation layer 1310. By either of these approaches, the second resistor structure 1312 is operatively exposed to the environmental conditions of the cavity 110, and the first resistor structure 1311 environmentally unexposed to the cavity 110.

The first and second resistor structures 1311 and 1312 are connected with one another and with further resistors R3 and R4 in a bridge circuit 1401 as schematically shown in FIG. 14. An excitation source provides a bias signal (e.g., a bias voltage VB) to the bridge circuit 1401, and an amplifier 1402 measures a bridge voltage to provide an output signal VOUT representing relative resistances R1, R2 of the first and second resistor structures 1311 and 1312. The amplifier 1402 in the example of FIG. 14 includes a differential input connected to opposite branches of the bridge circuit 1401, and a single-ended output 1403 provides the signal VOUT to a control circuit or controller 1404 (e.g., also fabricated in the semiconductor die 1302). The control circuit 1404 in one example operates a switch S to selectively connect the bias voltage signal VB to an upper branch of the bridge circuit 1401. The waveform 1502 in FIG. 15 illustrates an example switching control signal to set the closed or open state of the switch S. The control circuit 1404 receives a temperature signal TMP from an input 1416. The temperature signal TMP in one example is generated by a thermal sensing diode 1318 formed in the substrate 1302, shown in simplified form in FIG. 13. The diode 1318 is biased by a current source 1411 in the example of FIG. 14.

As schematically shown in FIG. 14, the sensor circuit further comprises a thermal control circuit 1410 that controls the temperature of the first resistor structure 1311. As previously discussed, the first resistor structure 1311 in FIG. 13 is covered by the first passivation layer 1310, and is therefore not exposed to the environmental conditions of the cavity 110. The thermal control circuit 1410 in this example includes a first conductive structure 1314, referred to as a cold plate. The structure 1314 is disposed proximate the first resistor structure 1311 such that the temperature of the structure 1314 represents a temperature associated with the first resistor structure 1311. In the example of FIG. 13, the cold plate conductive structure 1314 is disposed laterally in a middle portion of the metallization structure in the IMD dielectric layer 1304, and extends laterally under the annular first resistor structure 1311 and the second resistor structure 1312. In this example, further metallization layer via and conductor structures are connected between the first conductive structure 1314 and a contact structure 1316 formed on or in an upper surface of the semiconductor substrate 1302 near the temperature sense diode 1318. In this configuration, the diode 1318 senses a temperature associated with the first resistor structure 1311. The TMP signal from the temperature sense diode 1318 is provided to the control circuit 1404 via the input 1416 as schematically shown in FIG. 14. Although illustrated as using a diode 1318, other temperature sensing components can be used in other examples.

As shown in FIG. 13, one example of the semiconductor die assembly further includes a thermo-electric structure 1308 electrically connected to the first conductive structure 1314. In one implementation, the thermo-electric structure 1308 is a Peltier material structure, such as n-doped nanoparticles of Bismuth Telluride printed on a thermally and electrically insulating oxide or other dielectric material 1304. As shown in FIG. 14, the thermal control circuit 1410 also includes a driver 1412 (e.g., formed on and/or in the semiconductor substrate 1302). The driver 1412 has a first input to receive the TMP signal from the temperature sense diode 1318, and a second input to receive a setpoint signal SP. An output 1414 of the driver 1412 provides a current or voltage signal to the thermo-electric structure 1308. As shown in FIG. 13, the thermo-electric structure 1308 is formed in one example as an annular structure overlying portions of the upper first surface of the dielectric layer 1304, with a central opening laterally spaced from the first and second resistor structures 1311, 1312 and from the passivation material layers 1310 and 1313. The thermo-electric material 1308 is controlled by the driver 1412 to selectively provide heat to, or remove heat from, the first conductive structure 1314.

In one example, the driver 1412 implements a closed-loop thermal regulator to control the temperature of the first resistor structure 1311 according to the setpoint signal SP. As previously mentioned, the first resistor structure 1311 is covered by the passivation layer 1310 and is thus unexposed to the cavity 110. As a result, the regulator circuit implemented by the driver 1412, the temperature sense component 1318, and the thermo-electric material 1308 can stabilize the temperature of the first resistive structure 1311. In the bridge circuit 1401 of FIG. 14, therefore, the resistance R1 of the first resistive structure 1311 remains generally stable. At the same time, the second resistor structure 1312 is exposed to the cavity 110 (e.g., directly, or through a thin passive visitation layer material 1313). Thus, the resistance R2 of the second resistor structure 1312 changes with the temperature of the cavity 110 and the relative resistances R1 and R2 as measured by the amplifier 1402 will change according to environmental changes in the cavity 110.

As further shown in FIG. 13, the illustrated semiconductor by die structure 1302 in the sensor IC 1300 further includes annular conductive structures 1306 laterally outwardly spaced from one another on a first side of the dielectric layer 1304. An inner annular conductive structure 1306 is electrically connected to the first conductive structure 1314 and conducts a current 13 from the overlying thermo-electric structure 1308. A subsequent outlying annular conductive structure 1306 is laterally spaced outwardly from the inner annular conductive structure 1306, and conducts a larger current 12. In this example, a third annular conductive structure 1306 is laterally outwardly spaced from the second annular conductive structure 1306, and conducts a still larger current 11 from the thermo-electric structure 1308. An outer annular conductive structure 1306 in this example is proximate to the lateral outer edges of the dice structure, and is electrically connected to at least one bond pad. In this configuration, the outer annular conductive structure 1306 provides a thermal path to the electrical conductors 106 via the bond wires 112. The thermo-electric structure 1308 is formed over portions of the upper side of the dielectric layer 1304 between the annular conductive structures 1306, and operates to transfer heat in stages between the first conductive structure 1314 and the bond pad. In this manner, the combination of the thermo-electric material structure 1308 and the annular conductive structures 1306, provides a lateral thermal path to either draw heat from the cold plate 1314, or to provide heat to the cold plate 1314 as needed, in order to regulate the temperature of the first resistor structure 1311 at a temperature corresponding to the setpoint signal SP.

Conventional polymer-based humidity sensors calculate dewpoint using psychrometric lookup technique or calculation. However, these humidity sensors do not work well at low dewpoint levels. In addition, conventional humidity sensors are slow and tend to age. Chilled mirror sensors for automotive and other applications often use a Peltier or other thermo-electric element to cool a mirror to the condensation point causing interruption in reflected light. These sensors are typically very accurate, but are expensive to fabricate.

The sensor IC 1300 in FIG. 13 avoids a conductivity approach which is subject to contamination over time. In one example, the IC 1300 implements a dewpoint sensor that determines a time lag due to the latent heat of vaporization of condensate by using the cold plate conductive structure 1314 and the resistor bridge circuit 1401. The signal diagram 1500 in FIG. 15 shows a controlled bridge excitation signal waveform 1502 provided by the control circuit 1404 in FIG. 14, as well as sensor output voltage signal waveforms 1504, 1506 and 1508 in the sensor IC 1300. The control circuit 1404 implements digital control using the switch S and the driver 1412 drives the annular Peltier structure 1308 to cool the buried metal center cold plate conductive structure 1314 to a temperature slightly below a dewpoint that corresponds to the setpoint signal SP. The resistor structures 1311 and 1312 in one example are matched, high temperature coefficient metal resistors in the bridge circuit 1401. The second resistor structure 1312 is exposed to the cavity directly, or through the thin passivation layer 1313. The exposed second resistor structure 1312 in certain examples can also be exposed to the cavity 1310 through a thin IMD dielectric material (not shown).

The control circuit 1404 in one example applies a periodic excitation to the bridge via the switch S, represented as a pulse signal 1502 in FIG. 15. This causes incremental heating of the metal resistor structures 1311 and 1312. Because the first resistive structure 1311 R1, being in contact with passivation and by construction, will have more thermal mass than R2 (except when condensate is covering R2), when the conductive structure 1314 is above the dewpoint temperature, the amplified output signal VOUT from the circuit amplifier 1402 undergoes a discernible negative transient shown in the curve 1504 in FIG. 15. When the conductive structure 1314 is below the dewpoint temperature, and there is thermal mass over the second resistive structure 1312, the amplified output signal VOUT undergoes a slight positive response as shown in the curve 1506 in FIG.

15. This indicates to the control circuit 1404 that condensate exposed to the second resistive structure 1312 lags its heating relative to the first resistive structure 1311. As shown in the curve 1508 and FIG. 15, when the cold plate conductive structure 1314 is just barely below dewpoint temperature, the response of the amplified output signal VOUT will be of much higher positive amplitude as the heating of the second resistive structure 1312 is held fixed as energy flows into the structure 1312 to overcome the heat of vaporization of the condensate. While the second resistive structure 1312 is held fixed in temperature, the first resistive structure 1311 continues to heat resulting in a higher amplitude response in the amplified output signal VOUT. The control circuit 1404 accordingly extends the duration of the pulse in the waveform 1502 until the condensate evaporates in a closed loop fashion in response to the duration and polarity of the amplified output signal VOUT to increment the temperature of the conductive structure 1314 to a value just below dewpoint, and when this condition is achieved, the control circuit 1404 outputs the temperature reading represented by the signal TMP from the temperature sensing diode 1318.

Figure 16:
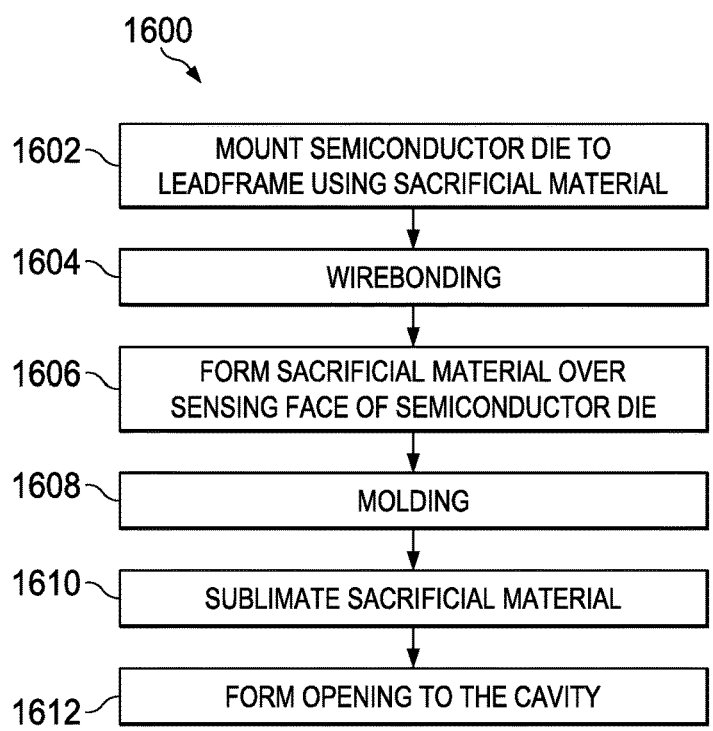
FIG. 16 is a flow diagram showing an example method of fabricating an electronic sensor according to one embodiment.

FIG. 16 illustrates an example method 1600 to fabricate an electronic sensor, such as the sensor ICs 100, 600 and 1300 described above. At 1602, a semiconductor die (e.g., 102, 605, 1302) is mounted to a leadframe structure (e.g., 104, 106) using a sacrificial material. At 1604, one or more bond wires 112 are connected between corresponding electrical conductors 108 of the leadframe structure 104, 106 and bond pads 114 of the semiconductor die 102, 605, 1302, using any suitable wire bonding processing steps and equipment. At 1606, a sacrificial material is formed over the sensing face of the semiconductor die, and a package material is formed at 1608 over the die, the bond wires 112 and portions of the leadframe structure 104, 106 to create a package structure 108. In one example, this processing includes a conventional molding process at 1608. At 1610, the sacrificial material is heated in order to sublimate the sacrificial material and create an internal cavity 110 defined by an interior surface of the package structure 108 and to expose the sensing face of the semiconductor die 102, 605, 1302. At 1612, an opening 116 is optionally formed in the material 108 as a separate step to connect the cavity 110 and the exterior of the a package structure 108. In other implementations, the opening 116 can be formed as part of the molding process at 1608.

Modifications are possible in the described embodiments, and other embodiments are possible, within the scope of the claims.

What is claimed is:

1. A sensor apparatus comprising:
   a package structure having an exterior surface, a continuous internal cavity defined by an interior surface, and an opening extending from the cavity through the exterior surface;
   a base having a surface exposed to and covering the continuous cavity; and
   a sensor structure within the continuous cavity and having an outer surface spaced from the interior surface and spaced from the surface of the base, the sensor structure including:
      a first resistor structure unexposed to the cavity;
      a second resistor structure electrically coupled to the first resistor structure and having a sensing face exposed to the cavity;
      a thermal control circuit configured to control a temperature of the first resistor structure wherein the thermal control circuit includes:
         a lateral conductive structure proximate the first resistor structure;
         a thermo-electric structure electrically coupled to the lateral conductive structure;
         a driver configured to provide a current or voltage signal to the thermo-electric structure to selectively provide heat to, or remove heat from, the lateral conductive structure;
         a thermal sensing component configured to sense a temperature of the lateral conductive structure and to provide a first signal to the driver; and
         the driver is configured to control the current or voltage signal according to the first signal and a setpoint signal to regulate the temperature of the first resistor structure;
      bond pads;
      a semiconductor substrate; and
      a dielectric layer on a first side of the semiconductor substrate;
   the thermal control circuit further includes annular conductive structures laterally outwardly spaced from one another on a first side of the dielectric layer, the annular conductive structures including inner annular conductive structures electrically coupled to the lateral conductive structure and outer annular conductive structures electrically coupled to the bond pads; and
   the thermo-electric structure is over portions of the first side of the dielectric layer between the annular conductive structures and configured to transfer heat in stages between the lateral conductive structure and the bond pads.

2. The sensor apparatus of claim 1, further comprising:
   electrical conductors having surfaces covered by the package structure;
   wires within the package structure and coupled to the electrical conductors;
   wherein the sensor structure is suspended and mechanically supported in the cavity exclusively by the wires.

3. The sensor apparatus of claim 1, wherein all of the outer surface of the sensor structure is spaced from the interior surface of the package structure and the surface of the base.

4. The sensor apparatus of claim 1, wherein the sensor structure further includes a first passivation layer over the first resistor structure.

5. The sensor apparatus of claim 4, wherein at least a portion of the sensing face of the second resistor structure is uncovered in the cavity.

6. The sensor apparatus of claim 4, wherein the sensor structure further includes a second passivation layer over the sensing face of the second resistor structure, wherein the second passivation layer is thinner than the first passivation layer.

7. The sensor apparatus of claim 1, wherein the sensor structure further includes circuitry coupled to the first and second resistor structures and configured to provide an output signal representing a change in an environmental condition of the cavity based on a change in relative resistances of the first and second resistor structures.

8. The sensor apparatus of claim 7, wherein the circuitry includes:
   a third resistor structure coupled to the first resistor structure in a first branch of a bridge circuit;
   a fourth resistor structure coupled to the second resistor structure in a second branch of the bridge circuit; and
   an amplifier having a first input coupled to the first branch and a second input coupled to the second branch.

9. A sensor apparatus comprising:
a package structure having an exterior surface, a continuous internal cavity defined by an interior surface, and an opening extending from the cavity through the exterior surface;
a base having a surface exposed to and covering the continuous cavity; and
a sensor structure within the continuous cavity and having an outer surface spaced from the interior surface and spaced from the surface of the base, the sensor structure including:
a resistor structure having top, bottom, and lateral sides exposed to the cavity, wherein one or more of the top, bottom, and lateral sides is a sensing surface;
an amplifier having an input coupled to the resistor structure;
a thermal control circuit configured to control a temperature of the first resistor structure wherein the thermal control circuit includes:
a lateral conductive structure proximate the first resistor structure;
a thermo-electric structure electrically coupled to the lateral conductive structure;
a driver configured to provide a current or voltage signal to the thermo-electric structure to selectively provide heat to, or remove heat from, the lateral conductive structure;
a thermal sensing component configured to sense a temperature of the lateral conductive structure and to provide a first signal to the driver; and
the driver is configured to control the current or voltage signal according to the first signal and a setpoint signal to regulate the temperature of the first resistor structure;
bond pads;
a semiconductor substrate; and
a dielectric layer on a first side of the semiconductor substrate;
the thermal control circuit further includes annular conductive structures laterally outwardly spaced from one another on a first side of the dielectric layer, the annular conductive structures including inner annular conductive structures electrically coupled to the lateral conductive structure and outer annular conductive structures electrically coupled to the bond pads; and
the thermo-electric structure is over portions of the first side of the dielectric layer between the annular conductive structures and configured to transfer heat in stages between the lateral conductive structure and the bond pads.

10. The sensor apparatus of claim 9, wherein the sensor structure further includes a voltage source and a resistor coupled to the resistor structure and the amplifier.

11. The sensor apparatus of claim 9, wherein the sensor structure further includes a current source coupled to the resistor structure and the amplifier.

12. The sensor apparatus of claim 9, wherein the resistor structure has a serpentine shape.

13. The sensor apparatus of claim 9, further comprising:
electrical conductors having surfaces covered by the package structure; and
wires within the package structure and coupled to the electrical conductors;
wherein the sensor structure is suspended and mechanically supported in the cavity exclusively by the wires.

14. The sensor apparatus of claim 9, further comprising:
a containing structure containing the package structure, base, and sensor structure;
a first coil coupled to the base inside the containing structure;
a second coil external to the containing structure; and
an integrated circuit coupled to the second coil and configured to provide power to and receive sensor data from the sensor structure via the first and second coils.

* * * * *